United States Patent
Kidu et al.

(10) Patent No.: US 8,012,526 B2
(45) Date of Patent: Sep. 6, 2011

(54) ELECTROLUMINESCENT ELEMENT AND MANUFACTURING METHOD THEREOF

(75) Inventors: Takashi Kidu, Hino (JP); Tsuyoshi Ozaki, Fuchu (JP)

(73) Assignee: Casio Computer Co., Ltd., Tokyo (JP)

( * ) Notice: Subject to any disclaimer, the term of this patent is extended or adjusted under 35 U.S.C. 154(b) by 1111 days.

(21) Appl. No.: 11/521,101

(22) Filed: Sep. 14, 2006

(65) Prior Publication Data

US 2007/0057627 A1    Mar. 15, 2007

(30) Foreign Application Priority Data

Sep. 15, 2005  (JP) ................. 2005-268484
Jun. 29, 2006  (JP) ................. 2006-180000

(51) Int. Cl.
  *B05D 5/06*   (2006.01)
  *B05D 3/02*   (2006.01)
  *B01J 19/00*  (2006.01)

(52) U.S. Cl. ........ 427/66; 427/372.2; 427/384; 427/457

(58) Field of Classification Search ............... 427/66, 427/457, 487, 545, 592, 372.2, 384
See application file for complete search history.

(56) References Cited

U.S. PATENT DOCUMENTS

| | | | |
|---|---|---|---|
| 6,626,717 B2 | 9/2003 | Miyashita et al. | |
| 2003/0132704 A1 * | 7/2003 | Aziz et al. | 313/506 |
| 2005/0189875 A1 * | 9/2005 | Nakada | 313/504 |

FOREIGN PATENT DOCUMENTS

| | | |
|---|---|---|
| EP | 1 178 546 A2 | 2/2002 |
| JP | 54-12037 B2 | 5/1979 |
| JP | 10-208880 A | 8/1998 |
| JP | 2000-353594 | 12/2000 |
| JP | 2002-100473 A | 4/2002 |
| JP | 2002-198172 A | 7/2002 |
| JP | 2002-203672 A | 7/2002 |
| JP | 3575468 | 7/2004 |
| JP | 2004-235078 A | 8/2004 |

OTHER PUBLICATIONS

Dongge Ma et al.; "Improvement of luminescence efficiency by electrical annealing in single-layer organic light-emitting diodes based on a conjugated dendrimer"; J. Phys. D: Appl. Phys. 35 (2002) 520-523.*
Korean Office Action dated Dec. 22, 2008 (4 pages), and English translation thereof (3 pages) issued in counterpart Korean Application No. 10-2007-7021326.
Chinese Office Action dated Jan. 9, 2009 (8 pages), and English translation thereof (7 pages) issued in counterpart Chinese Application No. 2006800099909.

(Continued)

Primary Examiner — James Lin
(74) Attorney, Agent, or Firm — Holtz, Holtz, Goodman & Chick PC

(57) ABSTRACT

The present invention improves luminance and light emitting efficiency of electroluminescent elements. A manufacturing method of electroluminescent elements includes forming a positive electrode on a substrate, forming an organic compound layer on the positive electrode, forming an electron injecting layer on the organic compound layer, and forming a transparent conductive film on the electron injecting layer, thus forming electroluminescent element. After forming the transparent conductive film on the electron injecting layer, by applying a voltage between the positive electrode and the transparent conductive film while heating the electroluminescent element, light emission of the electroluminescent element such as luminance and light emitting efficiency is improved.

11 Claims, 10 Drawing Sheets

OTHER PUBLICATIONS

Tae-Woo Lee and O Ok Park, "Effect of electrical annealing on the luminous efficiency of thermally annealed polymer light-emitting diodes", Applied Physics Letters, vol. 77, No. 21, Nov. 20, 2000, pp. 3334-3336, XP002408218 AIP, USA.

Japanese Office Action dated Jun. 8, 2010 and English translation thereof, issued in counterpart Japanese Application No. 2006-180000.

J. H. Ahn, C. Wang, N. E. Widdowson, C. Pearson, M. R. Bryce, M. C. Petty, Thermal annealing of blended-layer organic light-emitting diodes, Journal of Applied Physics, Sep. 1, 2005, vol. 98 No. 5, pp. 054508-1 to 054508-7.

Japanese Office Action dated Oct. 5, 2010 (and English translation thereof) in counterpart Japanese Application No. 2006-180000.

* cited by examiner

ELECTROLUMINESCENT ELEMENT AND MANUFACTURING METHOD THEREOF

CROSS-REFERENCE TO RELATED APPLICATIONS

This application is based upon and claims the benefit of priority from prior Japanese Patent Application No. 2005-268484, filed on Sep. 15, 2005, and Japanese Patent Application No. 2006-180000, filed on Jun. 29, 2006, the entire contents of which are incorporated herein by reference.

BACKGROUND OF THE INVENTION

1. Field of the Invention

The present invention relates to an electroluminescent element and manufacturing method thereof.

2. Background of the Invention

An organic electroluminescent element includes a laminated structure which has an organic compound layer between an anode and a cathode. When a forward bias voltage is applied between the anode and cathode, an electron and a positive hole recombines in the organic compound layer, and the organic compound layer emits light. An electroluminescent display panel in which an image is displayed by arranging a plurality of organic electroluminescent elements, each of which emits light of red, green, and blue, on a substrate in matrix has been realized.

In addition, in Japanese Laid-open Patent Specification No. 2000-353594, it is disclosed that among organic compound layers, there is a type that can be laminated on an electrode by an ink jet method, which is a wet coating method. In this method, an electrode is first made lyophilic by conducting oxygen plasma processing to the electrode, and when the electrode is subsequently coated with an organic compound containing solution, the organic compound containing solution coated on the electrode spreads over the anode entirely. Thus, an organic compound layer with a uniform film thickness can be formed.

In an electroluminescent display panel, organic electroluminescent elements are formed on a transparent substrate. There are mainly two types, a bottom emission type in which light emission is taken from the transparent substrate side, and a top emission type in which light emission is taken from the other side to the transparent substrate side. Concerning the bottom emission type, in case of an active matrix driving type, an opening ratio (ratio of luminescent area) of a sub pixel decreases due to the pixel transistor and the like that are provided on the substrate. However, concerning the top emission type, there is an advantage in that opening ratio can be improved without influence of pixel circuit and the like, since organic electroluminescent element can also be arranged on the pixel transistor.

Concerning the top emission type, it is required to form a pixel electrode and a monolayer or a plurality of layers of carrier transport layer including the organic luminescent layer, on a substrate, and form a counter electrode which serves as a transparent conducting layer thereon. As for a material used for the transparent conducting layer, metal oxides such as tin-doped indium oxide (ITO) and the like can be mentioned, and as a film forming method of such material, a film forming method such as sputtering and electron beam can be mentioned. However, with these film forming methods, the underlying carrier transport layer is damaged. Further, in a case where a metal layer with a low work function is provided between the metal oxide and the carrier transport layer in order to improve the injection efficiency of the carrier, a problem occurred in that the metal layer is oxidized by a trace amount of oxygen that exists in the processing.

SUMMARY OF THE INVENTION

An object of the present invention is to improve the luminance and light emitting efficiency of an electroluminescent element.

According to one aspect of the present invention, concerning a manufacturing method of an electroluminescent element, an electric field annealing processing that applies current within heating, with a current density of 50 to 375 A/m$^2$, is applied to the electroluminescent element formed with a series of an electrode, at least one layer of organic compound layer, and a counter electrode.

A manufacturing method comprises applying an electric field annealing processing that applies current within heating, to the electroluminescent element formed with a series of an electrode, at least one layer of organic compound layer, and a counter electrode.

Preferably, the heating temperature during the electric field annealing processing is lower than a glass transition temperature of the organic compound layer.

Preferably, the time of heating during the electric field annealing processing is 1 to 2 minutes.

Preferably, the time of current application during the electric field annealing processing is 1 to 2 minutes.

Preferably, either constant current or constant voltage may be applied during the electric field annealing processing.

Preferably, the electroluminescent element is a top emission type.

The present invention is especially effective for an electroluminescent element in which the counter electrode includes an electron injecting layer and a transparent conducting layer having metal oxide.

Another electroluminescent element manufacturing method of the present invention comprises applying an electric field annealing processing that applies current within heating for 1 to 2 minutes to the electroluminescent element formed with a series of an electrode, at least one layer of organic compound layer, and a counter electrode.

Still another electroluminescent element manufacturing method of the present invention comprises applying an electric field annealing processing that applies current within heating for 1 to 2 minutes, with current density of 50 to 375 A/m$^2$, to the electroluminescent element formed with a series of an electrode, at least one layer of organic compound layer, and a counter electrode.

According to the present invention, by applying a voltage or current between the electrode and the counter electrode within heating the electroluminescent element, luminescent characteristic such as luminance and light emitting efficiency can be improved.

DETAILED DESCRIPTION OF THE PREFERRED EMBODIMENTS

Preferred embodiments of the present invention will now be described with reference to the accompanying drawings. Although various kinds of preferred technical restrictions are added to the embodiments described hereinafter, the embodiments shall by no means restrict the scope of the invention to the embodiments and drawings described below. In the following descriptions, terminology "Electroluminescent" will be abbreviated as EL.

First Embodiment

Figure 1:
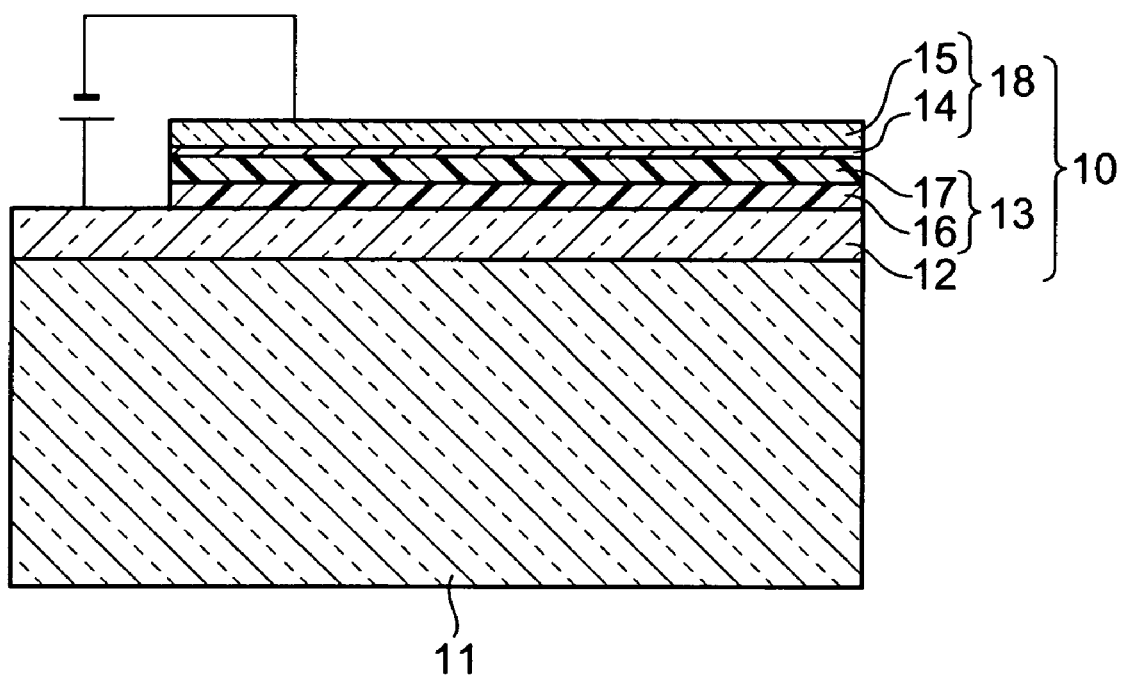
FIG. 1 is a cross sectional view of an electroluminescent element according to an embodiment of the present invention.

FIG. 1 is a cross sectional view of an organic EL element 10 cut in the direction of its thickness. The organic EL element 10 includes pixel electrode 12 (positive electrode), organic EL layer 13 (organic compound layer), and counter electrode 18 that are formed on substrate 11 in this order.

The pixel electrode 12 comprises a monolayer or a plurality of layers including at least a light reflecting conducting layer. Specifically, the pixel electrode 12 is obtained by conducting patterning as needed by photolithographic method and etching method, to an aluminum light reflecting conducting layer formed on substrate 11 and a transparent conducting layer formed thereon, that are formed by a vapor growth method. Here, tin-doped indium oxide (ITO), zinc-doped indium oxide, indium oxide ($In_2O_3$), tin oxide ($SnO_2$), zinc oxide (ZnO), and cadmium-tin oxide (CTO) can be mentioned as examples of the conducting layer. The obtained pixel electrode 12 serves as the anode of the organic EL element 10. Organic EL layer 13 comprises a monolayer or a plurality of layers including at least a light emitting layer comprising an organic compound. When a carrier transport layer other than an organic light emitting layer within the organic EL layer 13 is provided, the carrier transport layer may be an organic compound layer, or may be an inorganic compound layer. As for the carrier transport layer, positive hole transport layer, electron transport layer, and the like can be mentioned. The organic EL layer 13 formed on the pixel electrode 12 may be a two-layer structure of positive hole transport layer and light emitting layer, or may be a two-layer structure of light emitting layer and electron transport layer, a combination of carrier transport layer and light emitting layer, and number of layers can be set arbitrarily. In addition, these layer structures may also be a laminated structure mediated with an intermediate layer that restricts a carrier transporting characteristic of the other carrier transport layer, or may be other laminated structures.

On the pixel electrode 12, the organic EL layer 13 is formed by stacking a positive hole transport layer 16 as the carrier transport layer and a light emitting layer 17 including an organic compound in this order. As for the positive hole transport layer 16, PEDOT (polyethylene dioxythiophene) which is a conductive polymer, and PSS (polystyrene sulfonic acid) as a dopant are preferable. As for the light emitting layer 17, it is preferable to include a polymer with a conjugated double bond, such as polyphenylene-vinylene type light emitting material, polyfluorene based light emitting material, and the like.

The positive hole transport layer 16 and the light emitting layer 17 are formed by a wet coating method (ink jet method that jets fine droplets, and a nozzle print method that pours a liquid, for example). In this case, the positive hole transport layer 16 is first formed by coating the pixel electrode 12 with an organic compound containing a solution that contains PEDOT and PSS that become the positive hole transport layer 16. After they are dried to form the positive hole transport layer 16, an organic compound containing solution that contains light emitting material that becomes the light emitting layer 17 is coated thereon.

On the light emitting layer 17, a counter electrode 18 that functions as cathode is provided. The counter electrode 18 is provided with a thin electron injecting layer 14 that is on the organic EL layer 13 side, and a transparent conducting layer 15 is provided on the electron injecting layer 14. The electron injecting layer 14 is formed with a material that has a work function lower than that of the pixel electrode 12, and is formed with a single metal or metal alloy that includes at least one type among indium, magnesium, calcium, lithium, barium, and rare earth metals. It is also preferable that electron injecting layer is a thin film with a thickness of 0.1 nm to 50 nm, so that visible light can be transmitted. Alternatively, the electron injecting layer 14 may be a laminated structure that has layers of the aforementioned various kinds of materials stacked one on another.

On the electron injecting layer 14, transparent conducting layer 15 is formed by depositing a film of transparent conductive material (tin-doped indium oxide (ITO), zinc-doped indium oxide, indium oxide ($In_2O_3$), tin oxide ($SnO_2$), zinc oxide (ZnO), and cadmium-tin oxide (CTO) for example) by a vapor growth method.

Next, a manufacturing method of the organic EL element 10 will be described.

Initially, the conductive film is formed entirely on the surface of substrate 11 by a vapor growth method. Subsequently, by sequentially performing a photolithographic method and an etching method to the conductive film, pixel electrode 12 is patterned. When the pixel electrode 12 has a layer-structure with a plurality of layers, patterning may be conducted all at one time, or patterning may be conducted to the lower layer first and then to the upper layer, in which case cell reaction occurs when etching a plurality of layers. Subsequently, the entire substrate 11 is immersed into purified water and ultrasonic cleaning is conducted, followed by cleaning by generating oxygen plasma with a UV plasma apparatus, and lypophilization processing to the pixel electrode 12.

Next, a water soluble organic compound containing solution, which is a water solution of positive hole injecting material (for example, PEDOT which is a conductive polymer, and PSS which becomes a dopant), is coated on the pixel electrode 12. Thus, a positive hole transport layer 16 is formed. As for methods of coating, print methods such as an ink jet method (liquid droplet discharge method), a nozzle print method, or the like, and coating methods such as a dip coat method, a spin coat method, or the like, can be used.

After the positive hole transport layer 16 is formed, residual solvent is eliminated by drying the substrate 11 under temperatures of 160 to 200 degrees Celsius by heating a stage on which the substrate 11 is mounted, within the positive hole transport layer 16 which is exposed to atmospheric air.

Subsequently, light emitting materials of polymer with conjugated double bond for each pixel with different luminescent color are each dissolved in hydrophobic organic solvent (for example, xylene, tetralin, tetra methyl benzene, and mesitylene). As a result, an organic compound containing solution is prepared. Then the organic compound containing solution is coated on the positive hole transport layer 16. Since the organic compound containing solution is lipophilic, it rarely dissolves the positive hole transport layer 16. Herewith, light emitting layer 17 is formed on the positive hole transport layer 16. As for methods of coating, print methods such as an ink jet method (liquid droplet discharge method), a nozzle print method, and the like are used.

Then residual solvent is eliminated by drying the substrate 11 by heating the stage in an inert gas atmosphere (for example, under nitrogen gas atmosphere) or in vacuum. The substrate can also be dried by a sheathed heater provided in a film forming oven, under vacuum.

Next, electron injecting layer 14 is formed entirely on the light emitting layer by a vapor growth method. Specifically, a thin film of single metal or metal alloy that includes at least one type among indium, magnesium, calcium, lithium, barium, and rare earth metals, is applied to the entire surface by a vacuum deposition method. Subsequently, transparent conducting layer 15 which includes metal oxides such as tin-doped indium oxide (Indium Thin Oxide; ITO), zinc-doped indium oxide, and the like, is applied to the entire surface by a vapor growth method. Subsequently, a protecting sealing film may be formed entirely, as needed. As a result, the organic EL element 10 is formed on the transistor array panel 50. Here, it is preferable that the electron injecting layer 14 have a lower work function than the transparent conducting layer 15, from the point of view concerning the electron injecting characteristic. The electron injecting layer 14 is partially oxidized by oxygen contained in the metal oxide of transparent conducting layer 15, and an injection barrier of electrons occurs.

Next, electric field annealing processing is conducted to the organic EL element 10. Specifically, the organic EL element 10 is heated entirely, to a temperature lower than the glass transition temperature of either the positive hole transport layer 16 or the light emitting layer 17, whichever is lower. For example, 40 degrees Celsius or higher and 150 degrees Celsius or lower (annealing). Simultaneously, forward bias voltage is applied between the anode and cathode of the organic EL element 10, and current is applied. Voltage is applied such that the organic EL element 10 emits light. Here, the electric field annealing processing continues until the value of the voltage applied to the organic EL element 10 becomes constant while applying constant current to the organic EL element 10 continuously, or until the value of the current applied to the organic EL element 10 becomes constant while applying constant voltage to the organic EL element 10 continuously.

By going through the above electric field annealing processing, as shown in the examples described later, luminance and the light emitting efficiency of the organic EL element are improved. The following reasons can be considered.

When transparent conducting layer 15 is formed on the electron injecting layer 14 by the vapor growth method, material having a lower work function that forms the electron injecting layer 14 is partially oxidized at its interface with the transparent conducting layer 15, and the carrier (electron) injection barrier from the transparent conducting layer 15 to the light emitting layer 17 is formed. When voltage is applied while heating the organic EL element 10, the amount of transfer of carrier in the positive hole transport layer 16 and the light emitting layer 17 increases. As a result, externally applied voltage is concentrated at the injection barrier, of which the resistance has increased relative to that before the electric field annealing processing. As a result, an intense electric field is applied to the injection barrier. It is assumed that the structure of the interface of the electron injecting layer 14 and the transparent conducting layer 15 changes due to this intense electric field. As a result, the injection property of the electrons improve.

EXAMPLE 1

Embodiment is described further specifically by showing examples hereinafter.
[Preparation of Organic EL Element]
A glass substrate to which a pixel electrode comprising ITO was formed beforehand was ultrasonically cleaned in purified water, and the surface was cleaned by further conducting oxygen plasma processing using a UV plasma apparatus. Subsequently, PEDOT/PSS solution was spin coated to a pattern forming side of the glass substrate, and dried at 200 degrees Celsius for 20 minutes. As a result, a positive hole transport layer having a film thickness of approximately 50 nm was formed. Further, on the positive hole transport layer, a xylene solution of polyfluorene was spin coated, and dried. This produced a light emitting layer having a film thickness of approximately 70 to 80 nm. The glass substrate was then dried at 120 degrees Celsius for 30 minutes in vacuum conditions.

The substrate with the light emitting layer was placed in a chamber for vacuum deposition. The pressure was reduced to $10^{-4}$ Pa or less, and Ca was deposited on the light emitting layer at a film forming rate of 0.05 nm/s. As a result, an electron injecting layer having a film thickness of 12 nm was formed. Subsequently, a substrate having an electron injecting layer formed thereon was placed in a chamber with a target sputtering apparatus. A counter electrode having a film thickness of approximately 50 nm, comprising ITO, was sputter coated on the electron injecting layer under pressure of 0.1 Pa with electric power of 1.5 kW.
[Electric Field Annealing Processing]
The prepared organic EL element was placed on a hot plate inside a glove box in a nitrogen atmosphere. A voltage of 3.5 V in the forward bias direction was applied between the pixel electrode and the counter electrode while heating to 120 degrees Celsius, and the element emitted light until the current beccame constant (two minutes).

COMPARISON EXAMPLE 1

The counter electrode was formed with aluminum in place of ITO, and was applied for bottom emission type.

COMPARISON EXAMPLE 2

In the electric field annealing processing of example 1, heating was only conducted and voltage was not applied. All other processing was conducted in the same manner as set forth in example 1.

COMPARISON EXAMPLE 3

Processing was conducted in the same manner as example 1, except that the electric field annealing processing was not conducted.

Voltage was applied to the organic EL elements of example 1 and comparison examples of 1 through 3. Current and luminance were then measured. With regard to the luminance, the amount of light extracted from the lower side of the substrate concerning comparison example 1, and the sum of the light extracted from the upper side and lower side of the substrate concerning example 1 and comparison examples 2 and 3, were measured. The results are shown in FIGS. 2 through 4.

<Results>

Figure 2:
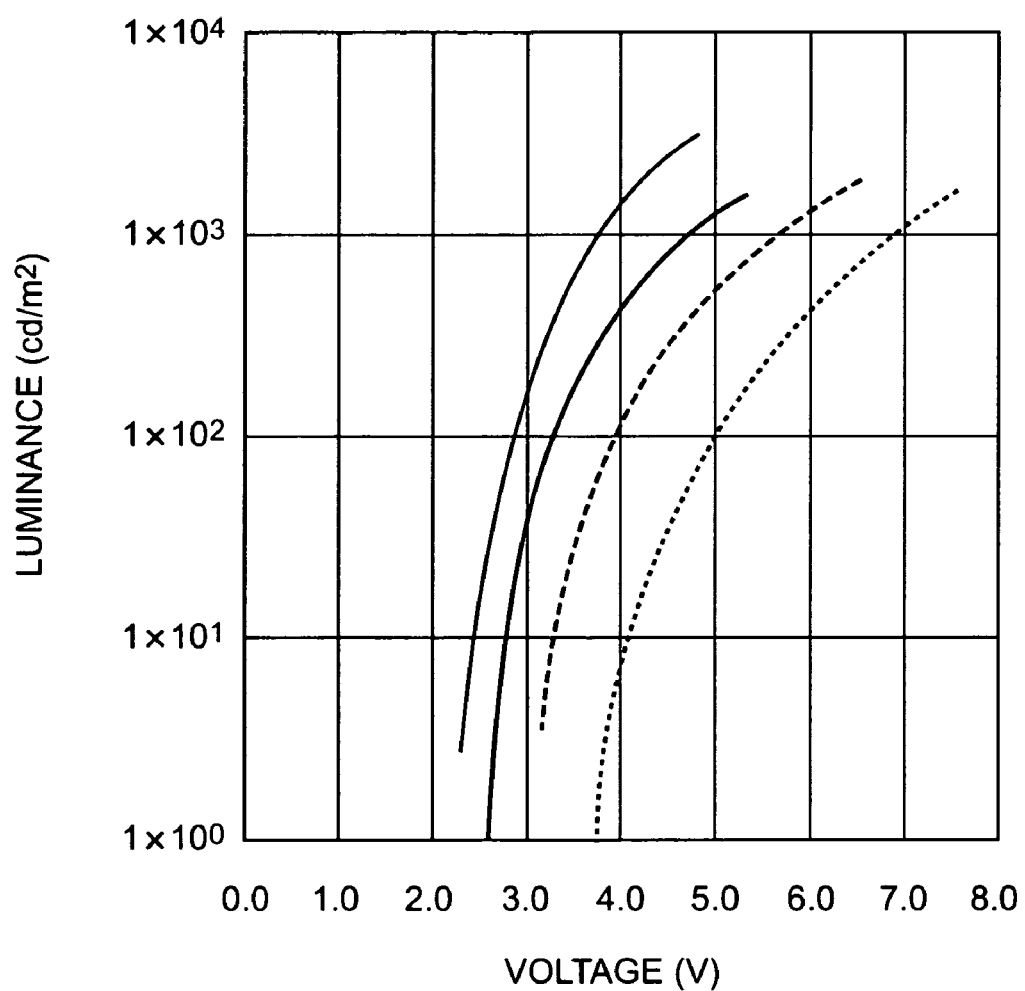
FIG. 2 is a graph showing a correlation between voltage applied to an organic electroluminescent element according to various examples, and obtained luminance.

FIG. 2 is a graph showing a correlation between voltage applied to organic EL elements of example 1 and comparison examples 1 through 3, and obtained luminance. Organic EL element that was applied with heat and voltage during an electric field annealing processing (example 1) has a light emitting property inferior to the one of a bottom emission type that has a counter electrode of a lower sheet resistance (comparison example 1). However, luminance obtained when the same amount of voltage was applied is higher than that of the one which was applied with only heat during the electric field annealing processing (comparison example 2) and the one which did not undergo the electric field annealing processing (comparison example 3). Therefore, it became obvious that required voltage to obtain the same luminance decreases.

Figure 3:
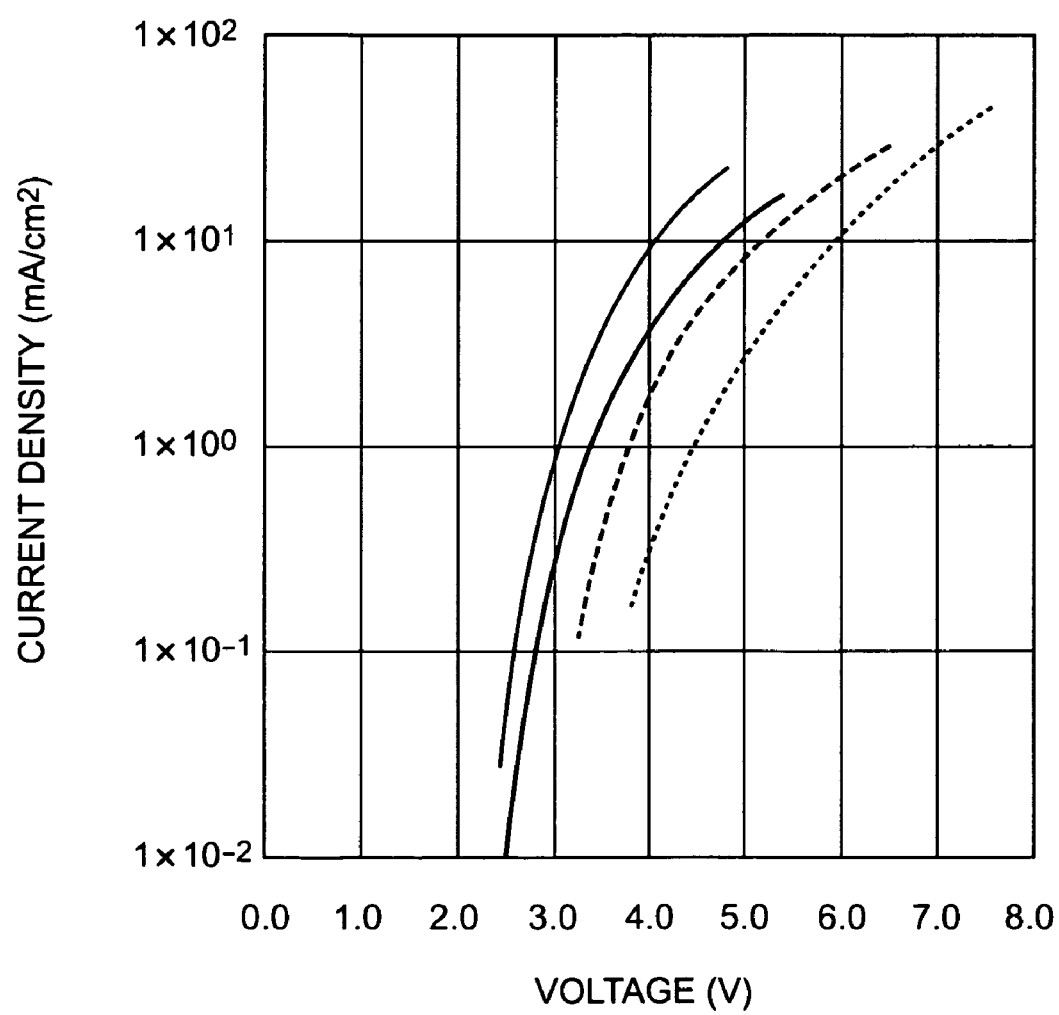
FIG. 3 is a graph showing current density as a function of the voltage applied to an organic electroluminescent element according to various examples.
Figure 4:
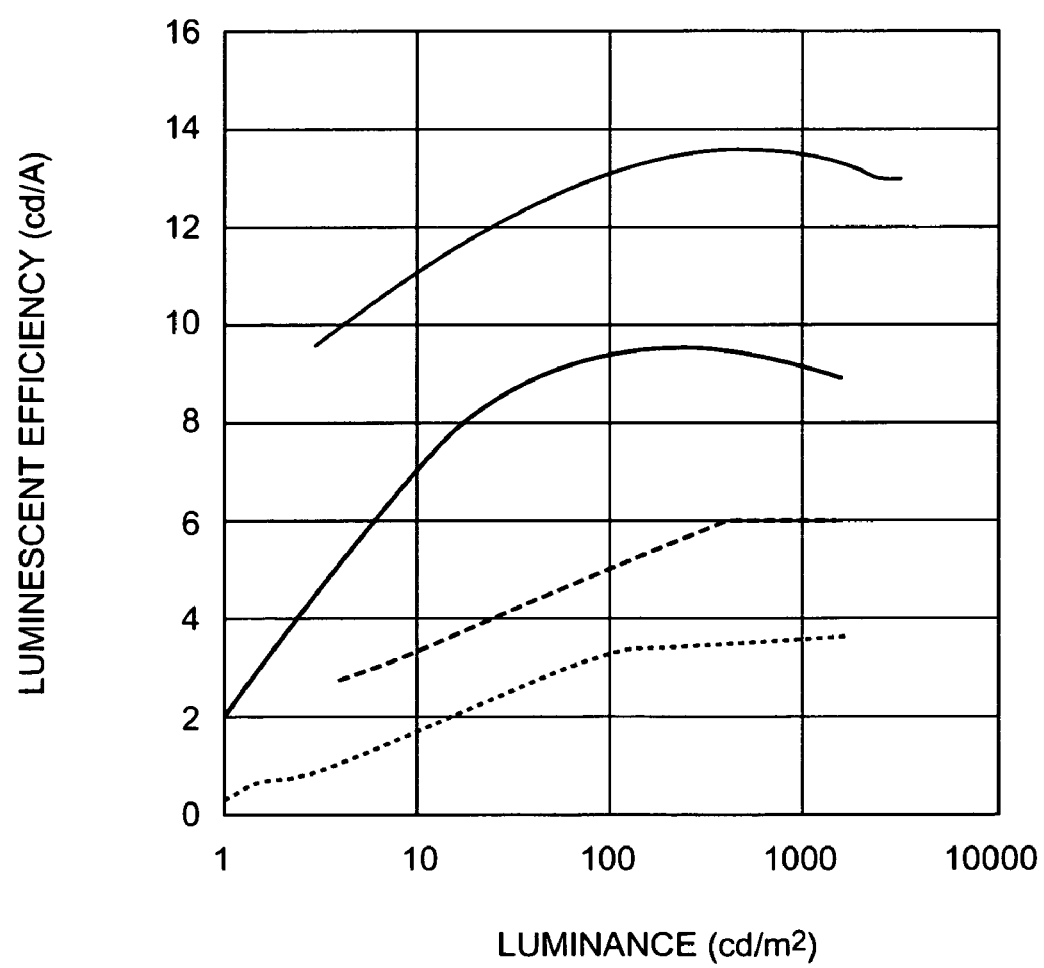
FIG. 4 is a graph showing a correlation between luminance and light emitting efficiency according to the electroluminescent elements of the examples.
Figure 5:
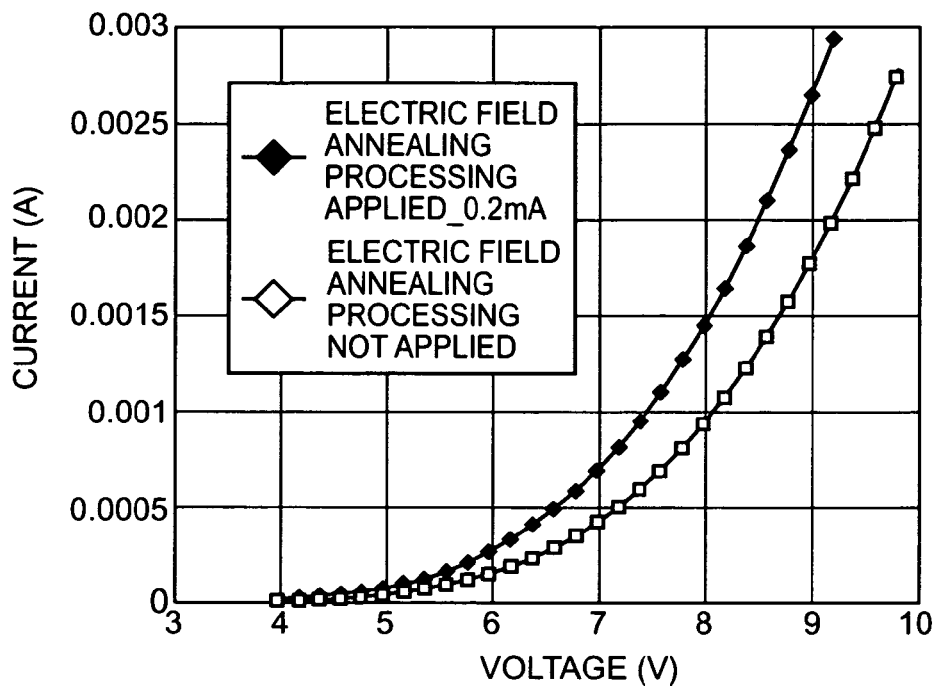
FIG. 5 is a graph showing a correlation between voltage and current for a case where 0.2 mA of current was applied during electric field annealing, and a correlation between voltage and current for a case where annealing is not applied.
Figure 6:
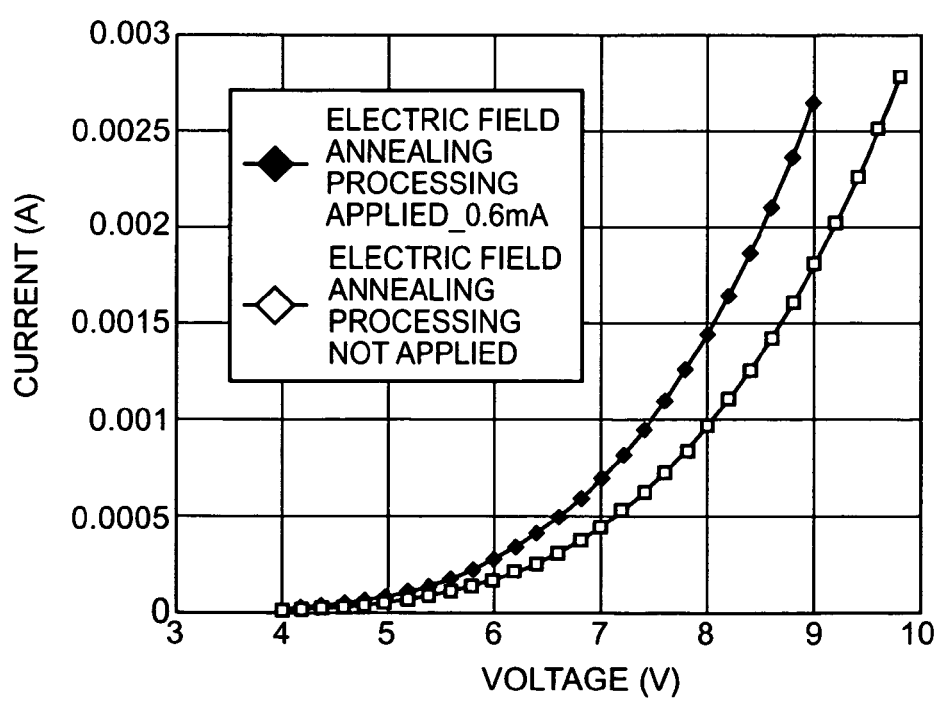
FIG. 6 is a graph showing a correlation between voltage and current for a case where 0.6 mA of current was applied during electric field annealing, and a correlation between voltage and current for a case where annealing is not applied.

FIG. 3 is a graph showing current density that flows when voltage is applied to organic EL elements of example 1 and comparison examples 1 through 3. Organic EL element that had heat and voltage applied thereto during electric field annealing processing (example 1) has a higher resistance in the counter electrode than the bottom emission type (comparison example 1). However, conductivity is improved as compared to the one which had only heat applied thereto during electric field annealing processing (comparison example 2), and as compared to the one which was not subject to electric field annealing processing (comparison example 3).

FIG. 4 is a graph showing the relationship between luminance and light emitting efficiency of the organic EL elements of example 1 and comparison examples 1 through 3. Organic EL element that had heat and voltage applied thereto during electric field annealing processing (example 1) has a lower light emitting efficiency as compared to the bottom emission type (comparison example 1). However, light emitting efficiency is improved as compared to the one which had only heat during electric field annealing processing (comparison example 2) and as compared to the one which was not subject to electric field annealing processing (comparison example 3).

As mentioned previously, it became obvious that, by applying heat and voltage during electric field annealing processing to an organic EL element of top emission type, element efficiency can be improved.

EXAMPLE 2

[Preparation of Organic EL Element]

A glass substrate to which a pixel electrode formed with ITO of 25 nm film thickness, on a metal alloy film having silver and aluminum as a base, was ultrasonically cleaned in purified water, and cleaning of the surface was conducted by oxygen plasma processing using a UV plasma apparatus. Subsequently, a PEDOT/PSS solution was spin coated to a pattern forming side of the glass substrate, and dried at 200 degrees Celsius for 20 minutes. As a result, a positive hole transport layer with film thickness of approximately 40 nm to 50 nm was formed. Further, on the positive hole transport layer, a xylene solution of polyfluorene was spin coated, dried, and a light emitting layer with a film thickness of approximately 70 to 80 nm was formed. The glass substrate was then dried at 120 degrees Celsius for 30 minutes in a vacuum.

The substrate with a light emitting layer formed thereon was placed in a chamber for vacuum deposition, pressure was reduced to $10^{-4}$ Pa or less, and Ca was deposited on the light emitting layer using a film forming rate of 0.05 nm/s. Thus, an electron injecting layer having a film thickness of 15 nm was formed. Subsequently, a substrate with an electron injecting layer formed thereon was placed in a chamber of a facing target sputtering apparatus, and a counter electrode having a film thickness of approximately 100 nm, comprising ITO, was sputter coated on the electron injecting layer under pressure of 0.1 Pa with electric power of 1.5 kW.

The organic EL element prepared as previously described is a panel provided with a plurality of pixels in a 2mm square. This panel was prepared in plurality, and without application of electric field annealing processing to one pixel. Current that flows in correspondence to voltage applied between the pixel electrode and the counter electrode was measured. Subsequently, after application of the electric field annealing processing to the other pixel, current that flows in correspondence to the voltage applied between the pixel electrode and the counter electrode was measured. The electric field annealing processing was conducted by applying constant current while heating at 120 degrees Celsius, for one minute under nitrogen atmosphere.

FIGS. 5 through 8 show the effects, concerning the respective other pixels of each panel, when constant current of 0.2 mA, 0.6 mA, 1.0 mA, and 1.5 mA is applied in the forward bias direction between the pixel electrode and the counter electrode during electric field annealing processing.

Figure 7:
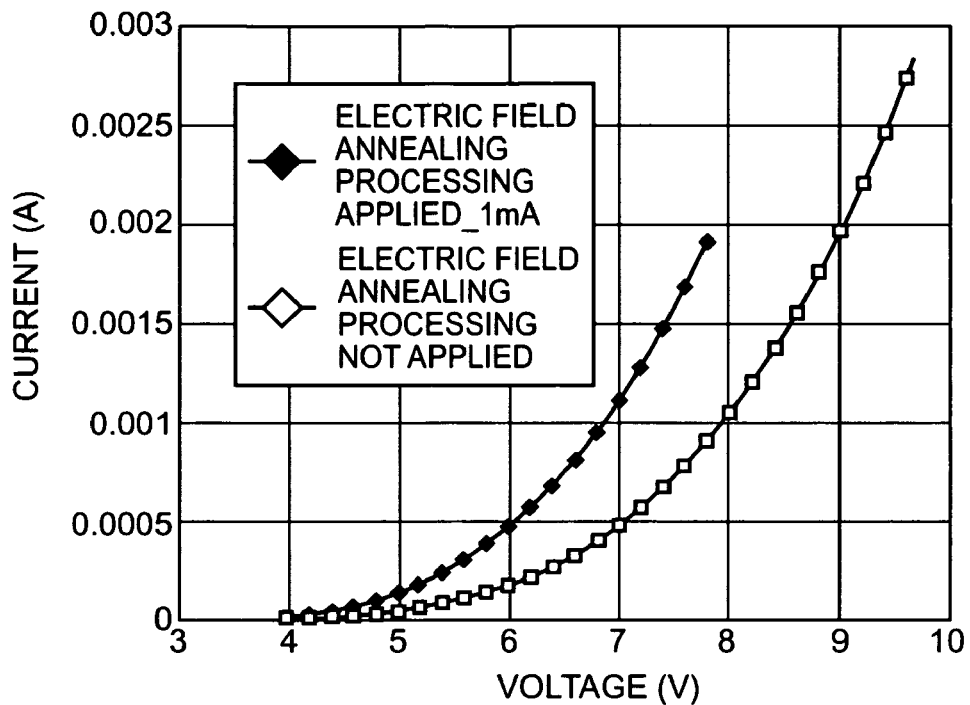
FIG. 7 is a graph showing a correlation between voltage and current for a case where 1.0 mA of current was applied during electric field annealing, and a correlation between voltage and current for a case where annealing is not applied.
Figure 8:
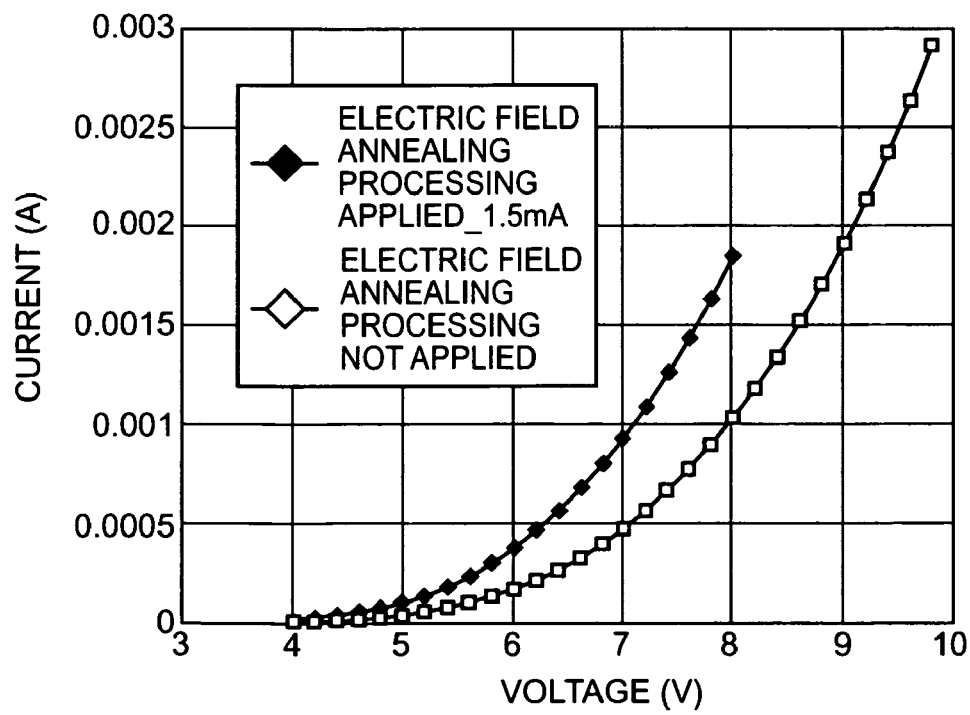
FIG. 8 is a graph showing a correlation between voltage and current for a case where 1.5 mA of current was applied during electric field annealing, and a correlation between voltage and current a case where annealing is not applied.
Figure 9:
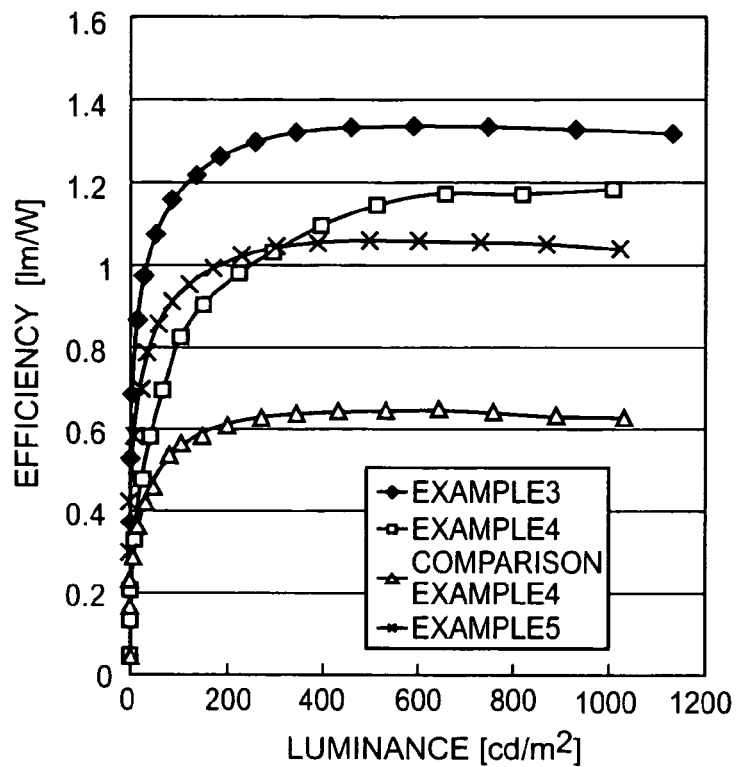
FIG. 9 is a graph showing a correlation between luminance and efficiency (lm/W) concerning examples 3-5 and comparison example 4.
Figure 10:
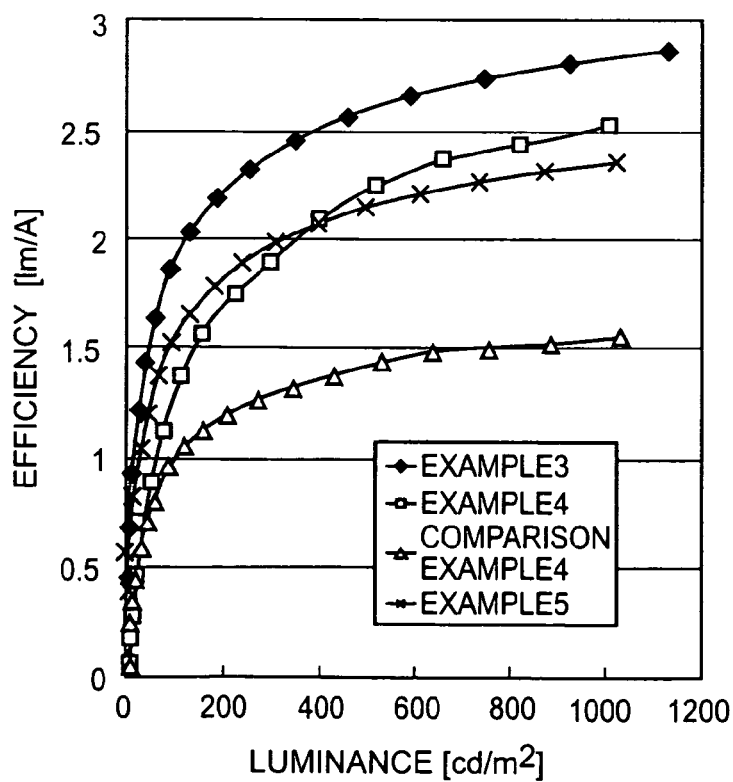
FIG. 10 is a graph showing a correlation between luminance and efficiency (cd/A) concerning examples 3-5 and comparison example 4.
Figure 11:
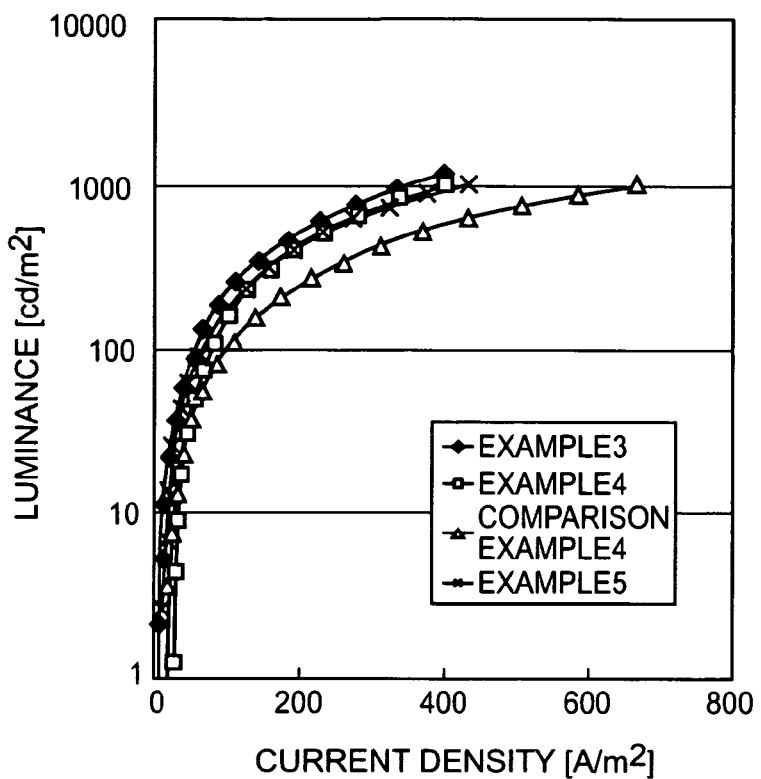
FIG. 11 is a graph showing a correlation between current density and luminance concerning examples 3-5 and comparison example 4.
Figure 12:
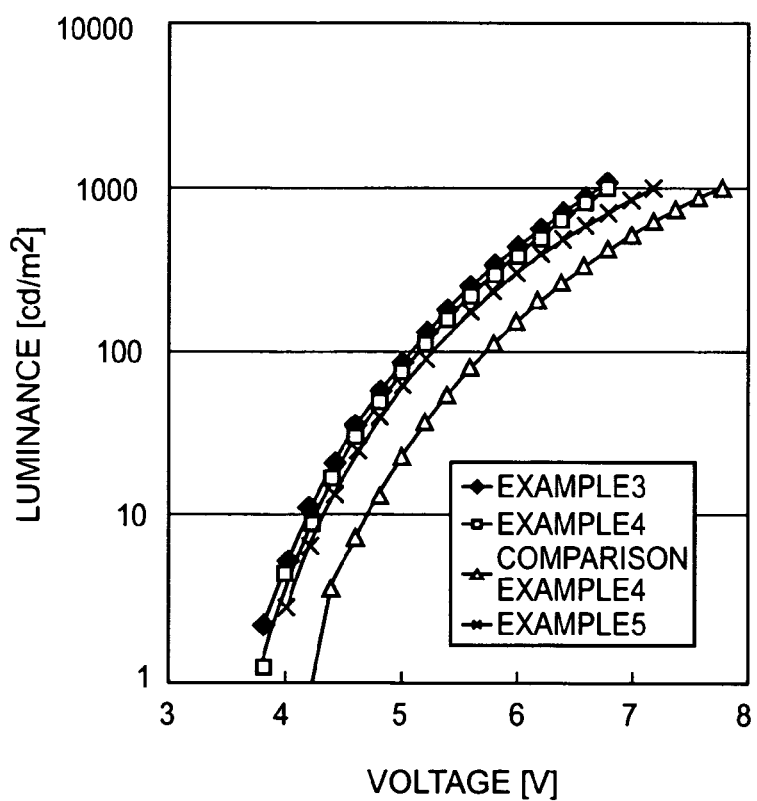
FIG. 12 is a graph showing a correlation between voltage and luminance concerning examples 3-5 and comparison example 4.
Figure 13:
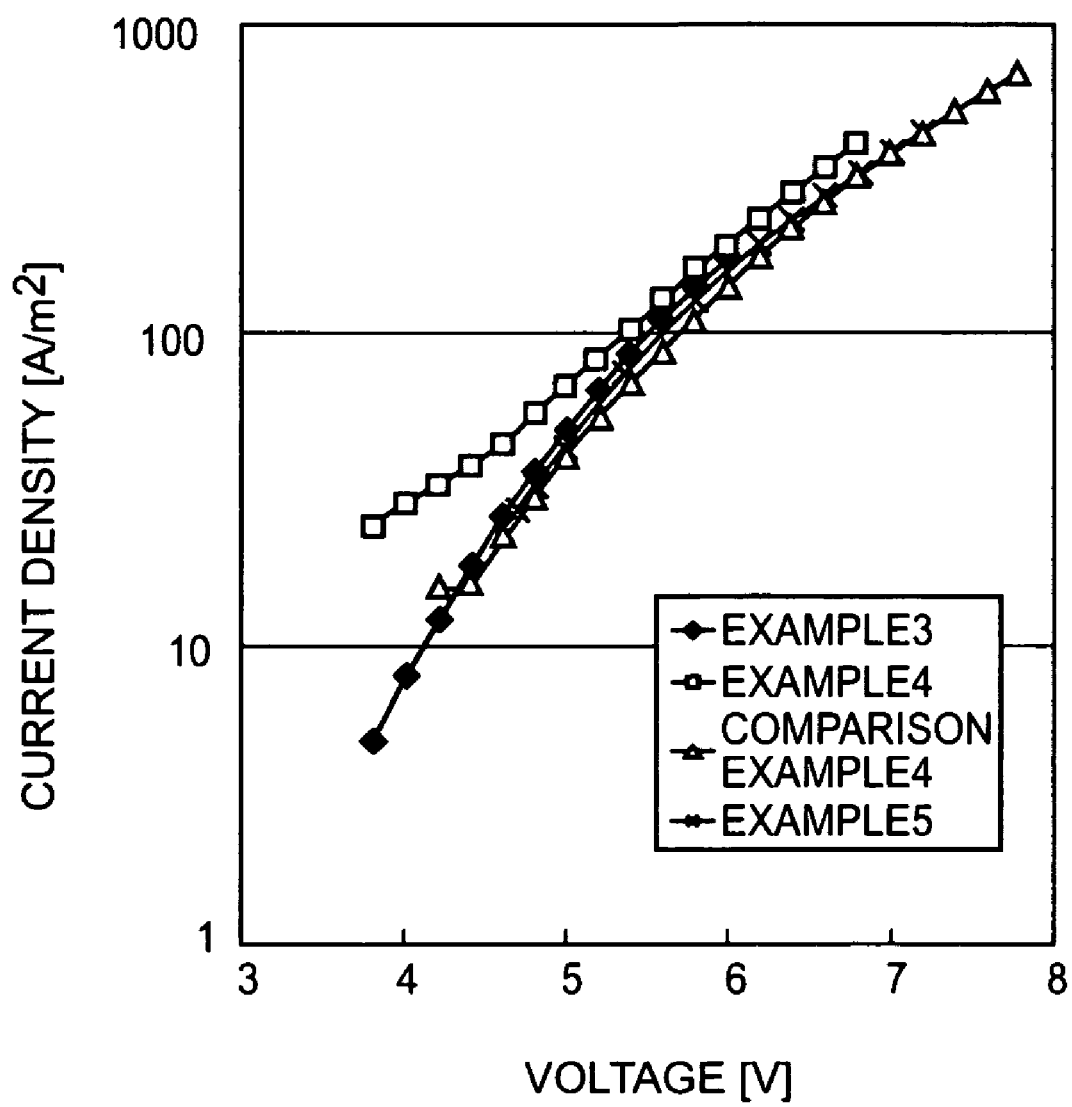
FIG. 13 is a graph showing a correlation between voltage and current density concerning examples 3-5 and comparison example 4.

It became obvious that, as shown in FIG. 7, which has a constant current of 1.0 mA applied during electric field annealing processing of 1.0 mA, that is, a current density of 250 A/m², had the highest current flowability. (that is, is capable of light emission.) This was followed by, the electric field annealing processing of 1.5 mA, that is, a current density of 375 A/m²; the electric field annealing processing of 0.6 mA, that is, a current density of 150 A/m²; and the electric field annealing processing of 0.2 mA, that is, a current density of 50 A/m²; in this order, to show higher current flowability, in other words, higher capability of light emission. As a result, by conducting electric field annealing processing with a current density of 50 to 375 A/m$^2$, effectiveness was obtained as compared to a case where electric field annealing processing was not conducted, and in particular, electric field annealing processing with current density of 250 to 375 A/m$^2$ was especially effective.

Here, the silver and aluminum metal alloy base thickness of each of the organic EL elements are substantially same, and does not significantly effect the order of characteristic shown in FIGS. 5 through 8. Further, it was confirmed that, concerning the annealing temperature during the electric field annealing processing, the characteristics significantly degrade when the annealing temperature exceeds the glass transition temperature of either the organic EL element or the plurality of carrier transport layers, whichever is lower. Thus, it is preferable that the annealing temperature be below the glass transition temperature of the carrier transport layer with the lowest glass transition temperature. In addition, significant improvement was not observed for electric field annealing processing for a temperature lower than 40 degrees Celsius.

EXAMPLE 3

Example 3 was conducted in the same manner as example 2, except that the electric field annealing processing applied a constant voltage of 6.0 V (initial current density of 179.3 A/m$^2$) between the pixel electrode and the counter electrode in the forward bias direction, for one minute in a nitrogen atmosphere, while heating at 120 degrees Celsius.

EXAMPLE 4

Example 4 was conducted in the same manner as example 2, except that the electric field annealing processing applied a constant voltage of 6.6 V (initial current density of 337.6 A/m$^2$) between the pixel electrode and the counter electrode in the forward bias direction, for one minute in a nitrogen atmosphere, while heating at 120 degrees Celsius.

EXAMPLE 5

Example 5 was conducted in the same manner as example 2, except that the electric field annealing processing applied a constant voltage of 3.5 V (initial current density of 7.0 A/m$^2$) between the pixel electrode and the counter electrode in the forward bias direction, for ten minutes in a nitrogen atmosphere, while heating at 120 degrees Celsius.

COMPARISON EXAMPLE 4

Processing was conducted in the same manner as example 2, except that electric field annealing processing was not conducted.

FIGS. 9 through 13 show the correlation between luminance and efficiency (lm/W), the correlation between luminance and efficiency (cd/A), the correlation between current density and luminance, the correlation between voltage and luminance, and the correlation between voltage and current density; concerning examples 3 through 5 and comparison example 4.

Examples 3 through 5 each have improved characteristics, as compared to the comparison example, and significant improvement in efficiency was observed in example 3. Therefore, it was confirmed that application of current that fairly exceeds the threshold value of the organic EL element, for a relatively short time, as the case with example 3, is more effective than application of low voltage which only allows current of approximately the threshold of the organic EL element, for a relatively long time, as the case of example 5.

Therefore, concerning the conditions of the electric field annealing processing, it is preferable that the application of current or voltage in the direction of forward bias while heating last for approximately one to two minutes, while current density is 50 to 375 A/m2, and while the heating temperature is lower than the glass transition temperature of the organic EL element or the single or plurality of layers of carrier transport layer, whichever is lower.

Second Embodiment

Figure 14:
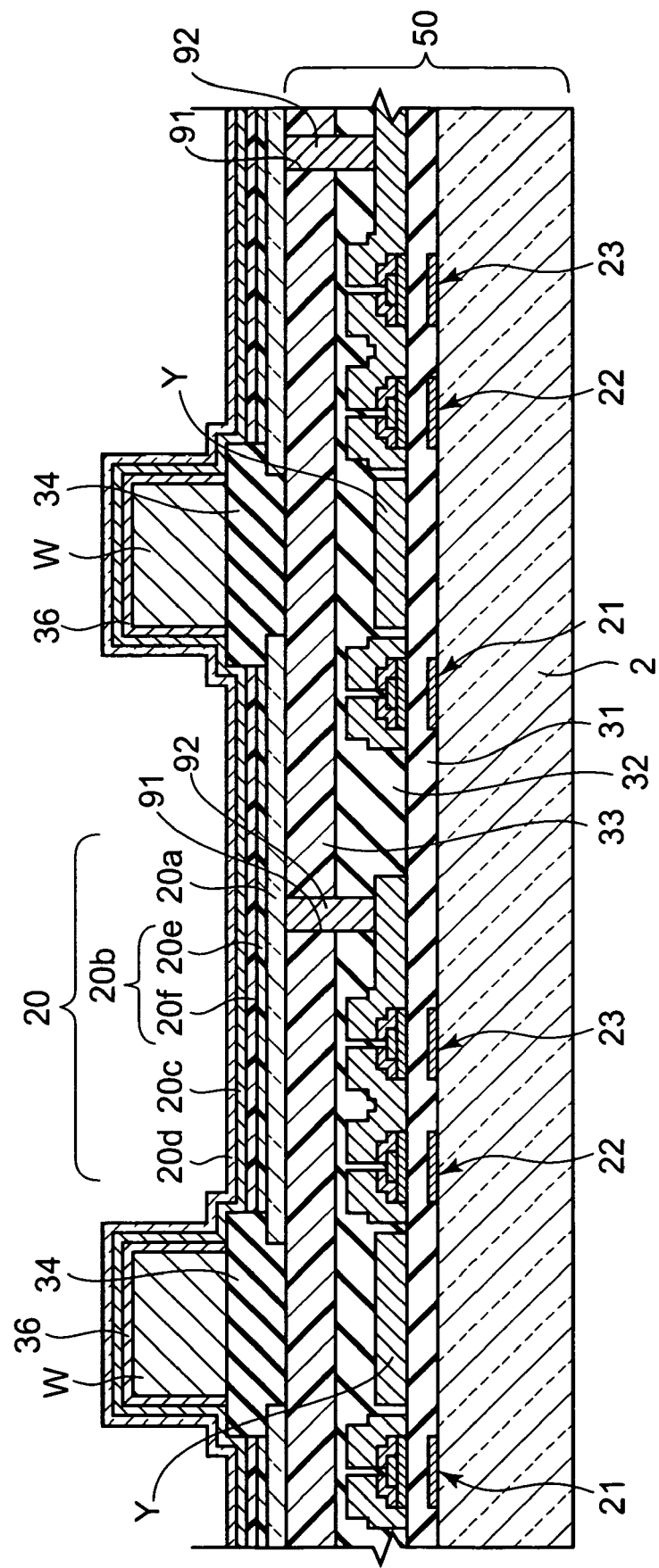
FIG. 14 is a cross sectional view of an electroluminescent display panel according to an embodiment of the present invention.

FIG. 14 is a cross sectional view of the EL display panel taken in the thickness direction. Concerning this EL display panel, the pixel of one dot includes sub-pixels of red, blue, and green, which are arranged in a matrix. When focused on the arrangement in the horizontal direction, sub-pixels are repeatedly arranged in the order of a red sub-pixel, a blue sub-pixel, and a green sub-pixel. When focused on the arrangement in the vertical direction, the same color is arranged in one row.

Concerning this EL display panel, a plurality of scanning lines (not shown), signal line Y, and supplying line (not shown) are provided to output various kinds of signals to the sub-pixels. The scanning line and the supplying line run are configured so as to be orthogonal to the signal line Y respectively.

Sub-pixels include three n-channel type transistors 21 through 23, a capacitor (not shown), and an organic EL element 20. The three n-channel type transistors 21 through 23 and the capacitor apply voltage to the organic EL element 20 corresponding to the input signal of the scanning line, signal line Y, and the supplying line.

As shown in FIG. 14, transistors 21 through 23 are disposed on an insulating substrate, and one electrode of capacitor, scanning lines, and supplying lines, that are not shown, are provided as well, and are all coated with shared gate insulating film 31. On the insulating film 31, the source and drain of transistors 21 through 23, an other electrode of the capacitor, and signal line Y are provided, and are coated with shared protective insulating film 32.

Laminated to the protective insulating film 32 is a planarizing film 33, which is a cured resin. The surface of the planarizing film 33 is smooth. This resolves unevenness arising from transistors 21 through 23, the scanning line, the signal line Y, and the supplying line. Here, the laminated structure from the insulating substrate 2 to the planarizing film 33 is the transistor array panel 50.

On the planarizing film 33, sub-pixel electrode 20a (pixel electrode) is arranged in matrix. Here, the sub-pixel electrode 20a is formed by patterning conductive film (tin-doped indium oxide (ITO), zinc-doped indium oxide, indium oxide ($In_2O_3$), tin oxide ($SnO_2$), zinc oxide (ZnO), and cadmium-tin oxide (CTO) for example), using a photolithographic method and an etching method. Here, the conductive film is formed on the planarizing film 33 by vapor growth method. To each sub-pixel, contact hole 91 is formed so as to penetrate the planarizing film 33 and the protective insulating film 32. Sub-pixel 20a is connected to the source of transistor 23 by conductive pad 92 embedded in the contact hole 91.

On the planarizing film 33, besides the sub-pixel electrode 20a, insulating film 34 is also formed. The insulating film 34 is formed in a net like structure so as to thread its way between sub-pixel electrodes 20a, as well as overlapping the outer portion of the sub-pixel electrode 20a so as to surround the sub-pixel electrode 20a.

On the insulating film 34, a metal barrier wall W, comprising copper, silver, gold, aluminum, or alloy with such metals as the major components, is formed. The metal barrier wall W runs perpendicularly in between a row of sub-pixels 20a in a perpendicular direction and its adjacent row of sub-pixels 20a. The metal barrier wall W is also parallel to the signal line Y and overlaps with the signal line Y when observed by a planer view. The metal barrier wall W is formed by a plating method, and is sufficiently thick compared to each electrode of transistors 21 through 23, the scanning line, the signal line Y, and the supplying line. In addition, the metal barrier wall W is connected with each other at outside of a region where the sub-pixel is arranged, and conductively connects with electron injecting layer 20c and counter electrode 20d (transparent conductive film). The metal barrier wall W reduces the sheet resistance of electron injecting layer 20c and the counter electrode 20d, and provides an effect so as to eliminate the potential difference within the film of electron injecting layer 20c and counter electrode 20d. Here, gold plating may be provided on the surface of the metal barrier wall W so as to further improve conductivity.

On the surface of the metal barrier wall W, a liquid repellent conducting layer 36 having liquid repellency is applied. The liquid repellent conducting layer 36 is applied by oxidative adsorption of triazyl trithiol expressed by chemical formula (1) to the surface of the metal barrier wall W. That is, reductive elimination of the hydrogen atom (H) of the mercapto group (—SH), and selective adsorption of the sulfur atom (S) to the surface of metal barrier wall W. Here, a condition in which a certain liquid has a contact angle of 50 degrees or more is defined as liquid repellency, and a condition in which a certain liquid has a contact angle of 40 degrees or less is defined as lyophilic.

[Chemical Formula (1)]

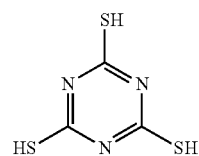

(1)

Since the liquid repellent conducting layer 36 is obtained by forming a significantly thin molecular structure of trizayl trithiol molecule on the surface of the metal barrier wall W, it has an extremely low resistance, and can be electrically connected in the direction of thickness. The triazyl trithiol molecule selectively bonds to metal, however, it does not coat organic compounds or metal oxides such as ITO and the like to an extent that it shows liquid repellency. Here, in order to enhance liquid repellency, as shown in chemical formula (2), a derivative in which the mercapto group (—SH) is substituted with liquid repellent group including alkyl fluoride can be used in place of triazyl trithiol. The liquid repellent group may be one other than the one shown in chemical formula (2). Here, the compound of chemical formula (2) forms the liquid repellent conducting layer 36 by reductive elimination of the hydrogen atom (H) of mercapto group (—SH), and oxidative adsorption of the sulfur atom (S). to the surface of the metal barrier wall W.

[Chemical formula (2)]

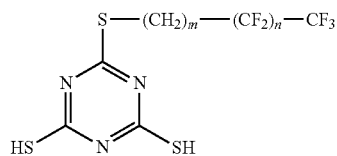

(2)

Here, m is an integer number of 1 or larger, preferably 2, and n is an integer number of 1 or larger, preferably 3.

On the sub-pixel electrode 20a, positive hole transport layer 20e and light emitting layer 20f are laminated in this order. Thus, organic EL layer 20b (organic compound layer) is formed. The positive hole transport layer 20e includes PEDOT which is a conductive polymer and PSS which is a dopant. The light emitting layer 20f includes a conjugated polymer such as polyphenylene binylene based light emitting material, polyfluorene based light emitting material, and the like. Here, the organic EL layer 20b may be further provided with an electron transport layer on the light emitting layer. In addition, the organic EL layer 20b may be a two-layer structure including a light emitting layer formed on the sub-pixel electrode 20a and an electron transport layer, and combination of carrier transport layer and light emitting layer can be set arbitrarily. Further, it may be a laminated structure provided with an interlayer that restricts carrier transport, in between appropriate layers concerning these layer structures, or it may also be an other laminated structure.

The positive hole transport layer 20e and the light emitting layer 20f are formed by a wet coating method (for example, ink jet method), after forming a liquid repellent conductive layer 36. In this case, an organic compound containing solution containing PEDOT and PSS that becomes the hole transport layer 20e is first coated on the sub-pixel electrode 20a to form a film, and then an organic compound including a solution containing a conjugated polymer based light emitting material, which becomes the light emitting layer 20f, is coated thereon to form film. Since a thick film of a metal barrier wall W is provided, and liquid repellent conductive layer 36 is further provided on the surface of the metal barrier conductive wall W, blending of the organic compound containing solution coated on the adjacent sub-pixel electrode 20a by going over the metal barrier wall W can be prevented.

Here, each material is set so that the light emitting layer 20f emits red light when the sub-pixel is red, the light emitting layer 20f emits green light when the sub-pixel is green, and the light emitting layer 20f emits blue light when the sub-pixel is blue.

On the light emitting layer 20f, an electron injecting layer 20c that forms the cathode of the organic EL element 20 is formed. The electron injecting layer 20c is a shared electrode that is formed for all the sub-pixels in common, and is formed on the entire surface. By forming the electron injecting layer 20c on the entire surface, the electron injecting layer 20c coats the metal barrier wall W with the liquid repellent conductive layer 36 sandwiched in between. Since the liquid repellent conductive layer 36 is an extremely thin film, the electron injecting layer 20c and the metal barrier wall W are conductively connected through the liquid repellent conductive layer 36. Since the metal barrier wall W is thoroughly provided, the electric potential of the electron injecting layer 20c is uniform at all sub-pixels.

The electron injecting layer 20c is formed with a material that has a work function lower than that of the sub-pixel electrode 20a, and is formed with a single metal or metal alloy that includes at least one type among indium, magnesium, calcium, lithium, barium, and rare earth metals. Alternatively, the electron injecting layer 20c may be a laminated structure that has layers of the aforementioned various kinds of materials stacked thereon.

On the electron injecting layer 20c, a counter electrode 20d (transparent conductive film) is formed by applying a film of transparent conductive material (tin-doped indium oxide (ITO), zinc-doped indium oxide, indium oxide ($In_2O_3$), tin oxide ($SnO_2$), zinc oxide (ZnO), and cadmium-tin oxide (CTO) for example) by a vapor growth method.

Here, the sub-pixel electrode 20a, the organic EL layer 20b, the electron injecting layer 20c, and the counter electrode 20d which are laminated in this order form the organic EL element 20.

Next, a manufacturing method to form the organic EL element 20 on the transistor array panel 50 and to manufacture the EL display panel is described.

Initially, contact hole 91 is formed on the protective insulating film 32 and the planarizing film 33 of the transistor array panel 50, and conductive pad 92 is formed in the contact hole 91 by a plating method or the like. At this time, contact hole 91 is formed so that the source of transistor 23 is exposed. However, the contact hole may be formed so that terminals of the scanning line, the signal line Y, and the supplying line are exposed.

Next, the conductive film is formed on the entire surface of the planarizing film 33 by a vapor growth method, and patterning of the sub-pixel electrode 20a is conducted by applying a photolithographic method and an etching method in this order, to the conductive film.

Subsequently, after forming the insulating film by the vapor growth method, the insulating film is applied with the photolithographic method and the etching method in this order, to pattern the insulating film into an insulating film 34 that is a net-like base layer. Thus, the sub-pixel electrode 20a is exposed. Next, a metal barrier wall W is formed by a plating method in between the sub-pixel electrodes 20a that are adjacent to each other in the horizontal direction, on the insulating film 34.

Then, the transistor array panel 50 is cleaned by the ultraviolet/ozone cleaning method.

Subsequently, by applying a coating to the surface of the transistor array panel 50 of a water solution containing a triazine thiol compound or triazine thiol derivatives (chemical formula (1) or chemical formula (2)), or by immersing the transistor array panel 50 into a water solution of triazine thiol compound or triazine thiol derivatives, surface treatment of the metal barrier wall W is conducted. In view of the properties of triazine thiol compounds or triazine thiol derivatives, a water solution of triazine thiol is coated on the surface of the metal barrier wall W, and a liquid repellent conductive layer 36 is formed on the surface of the metal barrier wall W. However, a liquid repellent conductive layer is sparsely formed on the surface of metal oxides such as sub-pixel electrode 20a and the insulating film.

Here, a fluoride type triazine thiol derivative given by the chemical formula (2) is hardly soluble or insoluble in water. However, it can be dissolved in a water solution of NaOH or KOH within the same mole amount, and a water solution of a fluoride type triazine thiol derivatives can be prepared. Concentration of the water solution is in the range of $1 \times 10^{-4}$ to $1 \times 10^{-2}$ mol/L. When a water solution including fluoride type triazine thiol derivatives is used, it is preferable that the temperature of the water solution is in the range of 20 to 30 degrees Celsius, and the time of immersion is in the range of 1 to 10 minutes. As the amount of fluoride type triazine thiol derivatives increases, liquid repellency is improved. However, since solubility in the solvent decreases, it is preferable that the amount is not excessive.

Here, in place of a water solution of triazine thiol of chemical formula (1) and chemical formula (2), a water solution of 6-dimethylamino-1,3,5-triazine-2,4-dithiol sodium salt can be used. The concentration of this water solution was adjusted to $1 \times 10^{-3}$ mol/L, the temperature of the water solution was kept in the range of 20 to 30 degrees Celsius, and the time of immersion was in the range of 1 to 30 minutes.

In addition, instead of using the water solution of triazine thiol, a water solution of 6-didodecylamino-1,3,5-triazine-2,4-dithiol sodium salt can be used. The concentration of this water solution was adjusted to $1 \times 10^{-3}$ mol/L, the temperature of the water solution was kept in the range of 30 to 50 degrees Celsius, and the time of immersion was in the range of 1 to 30 minutes.

Here, it is not limited to afore-mentioned trithiol or dithiol, and the solution may be a monothiol. In the case where a monothiol is used, one or two liquid repellent groups containing alkyl fluoride may be provided.

After the transistor array panel 50 was immersed into a water solution of triazine thiol such as chemical formula (1), chemical formula (2), or the like, the transistor array panel 50 was taken out and rinsed with alcohol. Thus, excess triazine thiol is removed.

Next, after the transistor array panel 50 is secondarily cleaned with water, the transistor array panel 50 is dried by spraying inert gas (nitrogen gas ($N_2$) for example) on the transistor array panel 50.

Subsequently, an organic compound including a solution that dissolves positive hole injecting materials (for example, PEDOT which is a conductive polymer, and PSS which becomes a dopant) in water, is coated on the sub-pixel electrode 20a. Here, the positive hole injecting material shows solubility concerning a hydrophilic solvent, and is hardly soluble or insoluble in the hydrophobic solvent. As for methods of coating, a print method such as an ink jet method (liquid droplet discharge method) or the like may be used, and a coating method such as a dip coat method, spin coat method or the like may be used. In order to form a positive hole transport layer 20e individually for each sub-pixel electrode 20a, a print method such as an ink jet method or the like is preferable.

In a case where the positive hole transport layer 20e is formed by the previously mentioned coating method, since a thick film metal barrier wall W is provided, and a liquid repellent conductive layer 36 is further provided on the surface of the metal barrier wall W, blending of the organic compound containing solution coated on adjacent sub-pixel electrodes 20a by going over the metal barrier wall W does not occur. Therefore, the positive hole transport layer 20e can be formed individually for each sub-pixel electrode 20a.

In addition, since the organic compound including solution coated on the sub-pixel electrode 20a does not become thick at an outer portion of the sub-pixel electrode 20a due to the liquid repellency of the liquid repellent conductive layer 36, a positive hole transport layer 20e can be formed with uniform thickness.

After the positive hole transport layer 20e is formed, the residual solvent is eliminated by drying the transistor array panel 50 by using a hot plate under temperatures of 160 to 200 degrees Celsius, within the positive hole transport layer 20e exposed to atmospheric air.

Thereafter, light emitting materials of conjugated polymer type, with luminescent colors of red, green, and blue, are each dissolved in a hydrophobic organic solvent (for example, tetralin, tetra methyl benzene, and mesitylene). Thus an organic compound containing solutions corresponding to red, green, and blue are prepared respectively. Then, an organic compound containing solution corresponding to red is coated on the positive hole transport layer 20e of the red sub-pixel, an organic compound containing solution corresponding to green is coated on the positive hole transport layer 20e of the green sub-pixel, and an organic compound containing solution corresponding to blue is coated on the positive hole transport layer 20e of the blue sub-pixel. Herewith, light emitting layer 20f is formed-on the positive hole transport layer 20e. As for methods of coating, print methods such as an ink jet method (liquid droplet discharge method) and the like is used, and coating is conducted for each color.

In a case where the positive hole transport layer 20e and light emitting layer 20f are formed by the aforementioned coating method, since a thick film metal barrier wall W is provided, and an active liquid repellent conductive layer 36 is further provided on the surface of the metal barrier wall W, blending of an organic compound containing solution coated on adjacent sub-pixels by going over the metal barrier wall W does not occur. Therefore, the light emitting layer 20f can be individually formed for each sub-pixel.

Then a residual solvent is eliminated by drying the transistor array panel 50 by using a hot plate in an inert gas atmosphere (for example, under nitrogen gas atmosphere). Here, it can be also dried by a sheathed heater in a vacuum.

Subsequently, an electron injecting layer 20c is formed on the entire surface by a vapor growth method. Specifically, a thin film of Ca or Ba is formed on the entire surface by a vacuum deposition method. Then, a counter electrode 20d is formed on the entire surface by the vapor growth method.

As a result, the organic EL element 20 is formed on transistor array panel 50.

Next, electric field annealing processing is conducted to the organic EL element 20 that is sealed by the sealing substrate. Specifically, the transistor array panel 50 that is attached with the sealing substrate is heated entirely, and is brought to a temperature between 40 degrees Celsius and 150 degrees Celsius (annealing). Simultaneously, a predetermined voltage or predetermined current is applied between sub-pixel electrode 20a and counter electrode 20d of the organic EL element 20. A voltage is applied at an extent that organic EL element 20 emits light. Here, electric field annealing processing is carried on until the value of voltage applied to the organic EL element 20 becomes constant while continuously applying constant current to the organic EL element 20, or until the value of current applied to the organic EL element 20 becomes constant while continuously applying constant voltage to the organic EL element 20.

Subsequently, ultraviolet curable or heat curable adhesive is coated on the sealing substrate (metal cap or glass substrate, for example), and the sealing substrate is attached to the counter electrode 20d by the adhesive.

Thus, an EL display panel is obtained.

According to this embodiment, in the same manner as the first embodiment, by going through the above electric field annealing processing, a light emitting property such as luminance and light emitting efficiency of the organic EL element 20 can be improved.

Here, the present invention is not limited to the aforementioned embodiments, and various kinds of modifications and changes in design can be conducted, so far as it does not deviate the scope of the invention.

For example, concerning electric field annealing processing, the temperature can be arbitrarily set to a temperature of 40 degrees Celsius or higher, and 150 degrees Celsius or lower. Within this temperature range, the organic EL layers 13 and 20b of the organic EL element do not substantially degrade, and also sufficient electric field annealing processing can be applied. In addition, the thickness of the positive hole transport layer, light emitting layer, and the like can be arbitrarily changed, as well as the voltage applied to the organic EL element can be arbitrarily changed according to such change.

What is claimed is:

1. A manufacturing method of an electroluminescent element which comprises an electrode, a counter electrode, and at least one layer of an organic compound layer between the electrode and the counter electrode, the manufacturing method comprising:
    applying an electric field annealing processing that applies current having a current density of 50 to 375 A/m$^2$ between the electrode and counter electrode of the electroluminescent element while heating the electroluminescent element with an additional heat source,
    wherein the counter electrode includes an electron injecting layer and a transparent conducting layer which contacts the electron injecting layer,
    wherein the electron injecting layer comprises at least one of indium, magnesium, calcium, lithium, barium, and rare earth metals,
    wherein the transparent conducting layer comprises a metal oxide, and
    wherein the transparent conducting layer is formed on the electron injecting layer by a vapor growth method.

2. The manufacturing method of the electroluminescent element as claimed in claim 1, wherein a heating temperature during the electric field annealing processing is lower than a glass transition temperature of the organic compound layer.

3. The manufacturing method of the electroluminescent element as claimed in claim 1, wherein a time duration of the heating during the electric field annealing processing is 1 to 2 minutes.

4. The manufacturing method of the electroluminescent element as claimed in claim 1, wherein a time duration of current application during the electric field annealing processing is 1 to 2 minutes.

5. The manufacturing method of the electroluminescent element as claimed in claim 1, wherein the electric field annealing processing applies constant current.

6. The manufacturing method of the electroluminescent element as claimed in claim 1, wherein the electric field annealing processing applies constant voltage.

7. The manufacturing method of the electroluminescent element as claimed in claim 1, wherein the electroluminescent element is a top emission type.

8. The manufacturing method of the electroluminescent element as claimed in claim 1, wherein the electron injecting layer contacts the organic compound layer.

9. The manufacturing method of the electroluminescent element as claimed in claim 1, wherein the metal oxide includes one of tin-doped indium oxide and zinc-doped indium oxide.

10. A manufacturing method of an electroluminescent element which comprises an electrode, a counter electrode, and at least one layer of an organic compound layer between the electrode and the counter electrode, the manufacturing method comprising:
    applying an electric field annealing processing that applies current having a current density of 50 to 375 A/m$^2$ between the electrode and counter electrode of the electroluminescent element while heating the electroluminescent element with an additional heat source,
    wherein the counter electrode includes an electron injecting layer which contacts the organic compound layer, and a transparent conducting layer which contacts the electron injecting layer,
    wherein the electron injecting layer comprises at least one of indium, magnesium, calcium, lithium, barium, and rare earth metals, wherein the transparent conducting layer comprises a metal oxide including one of tin-doped indium oxide and zinc-doped indium oxide, and wherein the transparent conducting layer is formed on the electron injecting layer by a vapor growth method.

11. A manufacturing method of an electroluminescent element which comprises an electrode, a counter electrode, and at least one layer of an organic compound layer between the electrode and the counter electrode, the manufacturing method comprising:

applying an electric field annealing processing that applies current having a current density of 50 to 375 A/m$^2$ between the electrode and counter electrode of the electroluminescent element while heating the electroluminescent element with an additional heat source, wherein the counter electrode includes an electron injecting layer which contacts the organic compound layer, and a transparent conducting layer which contacts the electron injecting layer, wherein the electron injecting layer comprises at least one of indium, magnesium, calcium, lithium, barium, and rare earth metals, wherein the transparent conducting layer comprises a metal oxide including one of tin-doped indium oxide and zinc-doped indium oxide, wherein a time duration of the heating during the electric field annealing processing is 1 to 2 minutes, and wherein the transparent conducting layer is formed on the electron injecting layer by a vapor growth method.

* * * * *